US010297569B2

(12) United States Patent
Edelstein et al.

(10) Patent No.: US 10,297,569 B2
(45) Date of Patent: *May 21, 2019

(54) METHOD OF FORMING A THREE-DIMENSIONAL BONDED SEMICONDUCTOR STRUCTURE HAVING NITRIDIZED OXIDE REGIONS

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,222

(22) Filed: Nov. 27, 2017

(65) Prior Publication Data
US 2018/0082976 A1 Mar. 22, 2018

Related U.S. Application Data

(62) Division of application No. 15/198,992, filed on Jun. 30, 2016, now Pat. No. 9,941,241.

(51) Int. Cl.
*H01L 23/00* (2006.01)
*H01L 25/065* (2006.01)
(Continued)

(52) U.S. Cl.
CPC .............. *H01L 24/83* (2013.01); *H01L 21/48* (2013.01); *H01L 24/80* (2013.01);
(Continued)

(58) Field of Classification Search
CPC ....... H01L 24/06; H01L 23/291; H01L 24/18; H01L 2224/32145; H01L 25/0657; H01L 25/50
See application file for complete search history.

(56) References Cited

U.S. PATENT DOCUMENTS 5,503,704 A 4/1996 Bower et al.
6,291,343 B1 9/2001 Tseng et al.
(Continued)

FOREIGN PATENT DOCUMENTS

EP 1275142 1/2003
WO 0161743 A1 8/2001

OTHER PUBLICATIONS

Warner, K., et al., "Low-temperature oxide-bonded three-dimensional integrated circuits," IEEE International SOI Conference, Oct. 2002, pp. 123-124.

(Continued)

*Primary Examiner* — Khiem D Nguyen
(74) *Attorney, Agent, or Firm* — Scully, Scott, Murphy & Presser, P.C.; Steven J. Meyers

(57) ABSTRACT

A first semiconductor structure including a first bonding oxide layer having a first metallic bonding structure embedded therein and a second semiconductor structure including a second bonding oxide layer having a second metallic bonding structure embedded therein are provided. A nitride surface treatment process is performed to provide a nitrided surface layer to each structure. Each nitrided surface layer includes nitridized oxide regions located in an upper portion of the bonding oxide layer and nitridized metallic regions located in an upper portion of the metallic bonding structures. The nitrogen within the nitridized metallic regions is then removed to restore the upper portion of the metallic bonding structures to its original composition. Bonding is performed to form a dielectric bonding interface between the nitridized oxide regions present in the first and second structures, and a metallic bonding interface between the first and second metallic bonding structures.

10 Claims, 7 Drawing Sheets

(51) Int. Cl.
  *H01L 25/00* (2006.01)
  *H01L 21/48* (2006.01)
(52) U.S. Cl.
  CPC .......... *H01L 25/0657* (2013.01); *H01L 25/50* (2013.01); *H01L 2224/83143* (2013.01); *H01L 2224/83203* (2013.01); *H01L 2224/83896* (2013.01)

(56) References Cited

U.S. PATENT DOCUMENTS

| | | | |
|---|---|---|---|
| 6,720,204 | B2 | 4/2004 | Sudijono et al. |
| 8,048,728 | B2 | 11/2011 | Yamazaki |
| 8,183,127 | B2 * | 5/2012 | Patti .................. H01L 21/76898 257/786 |
| 8,318,586 | B2 | 11/2012 | Libralesso et al. |
| 8,318,587 | B2 | 11/2012 | Shimomura et al. |
| 8,426,256 | B2 | 4/2013 | Hsiao et al. |
| 8,647,983 | B2 | 2/2014 | Di Cioccio et al. |
| 8,921,209 | B2 | 12/2014 | Bedell et al. |
| 9,293,431 | B2 | 3/2016 | Chang et al. |
| 9,368,566 | B2 | 6/2016 | Lee et al. |
| 9,496,239 | B1 | 11/2016 | Edelstein et al. |
| 9,620,479 | B1 * | 4/2017 | Edelstein ................ H01L 24/83 |
| 9,716,088 | B1 | 7/2017 | Edelstein et al. |
| 9,947,655 | B2 * | 4/2018 | Edelstein .......... H01L 23/53238 |
| 2003/0157748 | A1 * | 8/2003 | Kim .................. H01L 21/76804 438/107 |
| 2004/0061229 | A1 | 4/2004 | Moslehi |
| 2008/0224274 | A1 | 9/2008 | Yamazaki et al. |
| 2011/0084403 | A1 * | 4/2011 | Yang ...................... H01L 24/03 257/777 |
| 2011/0101537 | A1 * | 5/2011 | Barth ................ H01L 21/76898 257/774 |
| 2011/0129986 | A1 * | 6/2011 | Libralesso .......... H01L 21/2007 438/455 |
| 2012/0126425 | A1 | 5/2012 | Farooq et al. |
| 2012/0286395 | A1 | 11/2012 | Fischer |
| 2013/0122713 | A1 | 5/2013 | Rogers et al. |
| 2013/0164905 | A1 | 6/2013 | Yang et al. |
| 2014/0357093 | A1 | 12/2014 | Landru et al. |
| 2015/0108644 | A1 * | 4/2015 | Kuang .................... H01L 24/06 257/751 |
| 2015/0255139 | A1 | 9/2015 | Atsumi et al. |
| 2015/0364434 | A1 * | 12/2015 | Chen .................... H01L 23/498 257/773 |
| 2016/0043060 | A1 | 2/2016 | Kabe et al. |
| 2016/0254248 | A1 | 9/2016 | Shih |

OTHER PUBLICATIONS

Ventosa, C., et al., "Mechanism of thermal silicon oxide direct wafer bonding," Electrochemical and Solid-State Letters, Aug. 2009, pp. H373-H375, vol. 12, No. 10.

Eichler, M., et al., "Effects on silanol condensation during low temperature silicon fusion bonding," Journal of The Electrochemical Society, Aug. 2009, pp. H786-H793, vol. 156, 10.

Chua, S. L., et al., "Direct copper-copper wafer bonding with Ar/N2 plasma activation," International Conference on Electron Devices and Solid-State Circuits, Jun. 2015, pp. 134-137.

Tan, C. S., et al., "Low Temperature Wafer Bonding of Low-κ Carbon-Doped Oxide for Application in 3D Integration," Electrochemical and Solid-State Letters, vol. 13, No. 2, Nov. 2010, pp. H27-H29.

Di Cioccio, L., et al., "An innovative die to wafer 3D integration scheme: Die to wafer oxide or copper direct bonding with planarised oxide inter-die filling," International Conference on 3D System Integration, Sep. 2009, 3DIC, 4 pages.

List of IBM Patents or Patent Applications Treated as Related Filed Nov. 27, 2017, 2 Pages.

* cited by examiner

METHOD OF FORMING A THREE-DIMENSIONAL BONDED SEMICONDUCTOR STRUCTURE HAVING NITRIDIZED OXIDE REGIONS

BACKGROUND

The present application relates to a semiconductor structure and a method of forming the same. More particularly, the present application relates to a three-dimensional (3D) bonded semiconductor structure having maximized bonding strength for both dielectric bonding surfaces and metallic bonding structure surfaces. The present application also relates to a method of forming such a 3D bonded semiconductor structure.

Three-dimensional (3D) integration is critical in current and in future technology development. Traditionally, oxide-oxide bonding is performed to physically connect two wafers and, thereafter, through-silicon-vias (TSVs) are formed to electrically connect the two wafers.

In the most advanced 3D integration technology development, oxide-oxide and metal to metal (e.g., Cu—Cu) bonding are performed simultaneously. Accordingly, both oxide/oxide bonding strength and metal/metal contact are critical in order to meet the mechanical integrity requirement as well as the electrical performance. Presently, there is no known method that maximizes the bonding strength of both the oxide to oxide bond and the metal to metal bond.

SUMMARY

A first semiconductor structure including a first bonding oxide layer having a first metallic bonding structure embedded therein and a second semiconductor structure including a second bonding oxide layer having a second metallic bonding structure embedded therein are provided. A nitride surface treatment process is performed to provide a nitrided surface layer to each structure. Each nitrided surface layer includes nitridized oxide regions located in an upper portion of the bonding oxide layer and nitridized metallic regions located in an upper portion of the metallic bonding structures. The nitrogen within the nitridized metallic regions is then removed to restore the upper portion of the metallic bonding structures to its original composition. Bonding is performed to form a dielectric bonding interface between the nitridized oxide regions present in the first and second structures, and a metallic bonding interface between the first and second metallic bonding structures.

In one aspect of the present application, a three-dimensional bonded semiconductor structure is provided. In one embodiment of the present application, the three-dimensional bonded semiconductor structure includes a first semiconductor structure including a first wafer, a first interconnect structure, and a first bonding oxide layer containing first nitridized oxide regions and at least one first metallic bonding structure embedded therein. The bonded structure further includes a second semiconductor structure including a second wafer, a second interconnect structure, and a second bonding oxide layer containing second nitridized oxide regions and at least one second metallic bonding structure embedded therein. In the present application, a bonding interface is present between the first and second nitridized oxide regions and another bonding interface is present between the at least one first and second metallic bonding structures.

In another aspect of the present application, a method of forming a three-dimensional bonded semiconductor structure is provided. In one embodiment of the present application, the method may include providing a first semiconductor structure including a first wafer, a first interconnect structure, and a first bonding oxide layer containing at least one first metallic bonding structure embedded therein, and a second semiconductor structure including a second wafer, a second interconnect structure, and a second bonding oxide layer containing at least one second metallic bonding structure embedded therein. Next, a nitridation process is performed to provide a first nitrided surface layer comprising first nitridized oxide regions in an upper portion of the first bonding oxide layer and a first nitridized metallic region in an upper portion of the at least one first metallic bonding structure, and to provide a second nitrided surface layer comprising second nitridized oxide regions in an upper portion of the second bonding oxide layer and a second nitridized metallic region in an upper portion of the at least one second metallic bonding structure. Nitrogen is then removed from the first and second nitridized metallic regions so as to convert the first and second nitridized metallic regions into regions that have a same composition as the at least one first and second metallic bonding structures. Next, the first semiconductor structure is bonded to the second semiconductor structure, wherein the bonding provides a bonding interface between the first and second nitridized oxide regions and another bonding interface between the at least one first and second metallic bonding structures.

DETAILED DESCRIPTION

Figure 1A:
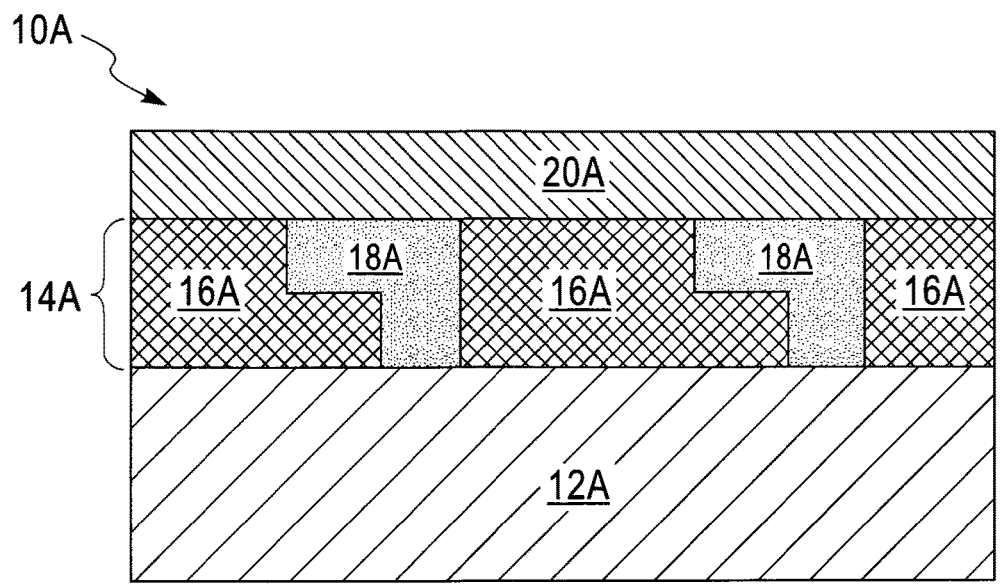
FIG. 1A is a cross sectional view of a first semiconductor structure including a first semiconductor wafer, a first interconnect structure, and a first bonding oxide layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Applicant has determined that that oxide-oxide bonding energy is directly enhanced through a direct nitridation process. However, a nitridized metal (i.e., copper, Cu) surface not only degrades the adhesion, but also has a negative impact on the electrical performance. Accordingly, Applicant has developed an integrated process to nitridized oxide-oxide and metallic (e.g., Cu—Cu) bonding regions and to selectively remove nitrogen from the nitridized metallic regions. The resulted structure maximizes the bonding strength for both oxide (nitridized)-oxide (nitridized) and the metallic bonding structures (i.e., Cu—Cu).

Figure 1B:
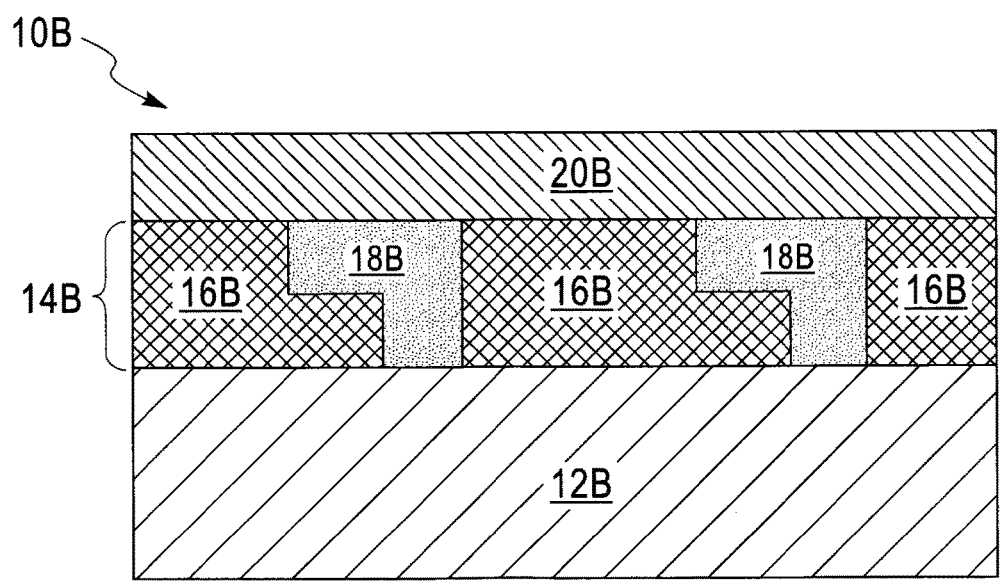
FIG. 1B is a cross sectional view of a second semiconductor structure including a second semiconductor wafer, a second interconnect structure, and a second bonding oxide layer.

Referring first to FIGS. 1A and 1B, there are shown a first semiconductor structure 10A and a second semiconductor structure 10B that can be employed in the present application. In the present application and following subsequent processing steps, the first and second structures (10A, 10B) will be bonded to each other.

The first semiconductor structure 10A includes a first semiconductor wafer 12A, a first interconnect structure 14A, and a first bonding oxide layer 20A. The first interconnect structure 14A includes at least one interconnect dielectric material 16A including one or more interconnect metallic structures 18A embedded therein. The second semiconductor structure 10B includes a second semiconductor wafer 12B, a second interconnect structure 14B, and a second bonding oxide layer 20B. The second interconnect structure 14B includes at least one interconnect dielectric material 16B including one or more interconnect metallic structures 18B embedded therein.

The first semiconductor wafer 12A and the second semiconductor wafer 12B both include a semiconductor substrate (not separately shown) having one or more semiconductor devices (also not separately shown) formed thereon. The semiconductor substrate that can be used as a component of the first and second semiconductor wafers (12A, 12B) may include a semiconductor material that has semiconducting properties. The semiconductor material that can provide the semiconductor substrate of the first and second semiconductor wafers (12A, 12B) may include, but is not limited to, silicon (Si), germanium (Ge), silicon germanium alloys (SiGe), silicon carbide (SiC), III-V compound semiconductors, II-VI compound semiconductors or multilayered combinations thereof. In some embodiments, the semiconductor material that provides the semiconductor substrate of the first semiconductor wafer 12A may be the same as a semiconductor material that provides the semiconductor substrate of the second semiconductor wafer 12B. In yet other embodiments, the semiconductor material that provides the semiconductor substrate of the first semiconductor wafer 12A may be different from the semiconductor material that provides the semiconductor substrate of the second semiconductor wafer 12B.

In some embodiments, the semiconductor substrate of the first and second semiconductor wafers (12A, 12B) may be a bulk crystalline substrate. The term "bulk" denotes the entirety of the crystalline substrate is composed of at least one crystalline material with no insulators and/or conductive materials present therein.

In yet other embodiments of the present application, the semiconductor substrate of the first and second semiconductor wafers (12A, 12B) may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

The one or more semiconductor devices that can be present on the semiconductor substrate of the first and second semiconductor wafers (12A, 12B) may include, for example, transistors, capacitors, diodes, and/or resistors. The one or more semiconductor devices can be formed utilizing techniques that are well known in the semiconductor industry. For example, transistors may be formed utilizing a gate-first process or a gate-last process (also referred as to a replacement gate process). So as not to obscure the processing steps of the present application, the techniques used in forming the one or more semiconductor devices are not described herein in detail.

As mentioned above, the first semiconductor structure 10A includes a first interconnect structure 14A that contains at least one interconnect dielectric material 16A including one or more interconnect metallic structures 18A embedded therein, while the second semiconductor structure 10B includes a second interconnect structure 14B that includes at least one interconnect dielectric material 16B including one or more interconnect metallic structures 18B embedded therein.

The at least one interconnect dielectric material (16A, 16B) of the first and second interconnect structures (14A, 14B) may include any interlevel or intralevel dielectric including inorganic dielectrics or organic dielectrics. In one embodiment, the least one interconnect dielectric material (16A, 16B) of the first and second interconnect structures (14A, 14B) may be non-porous. In another embodiment, the least one interconnect dielectric material (16A, 16B) of the first and second interconnect structures (14A, 14B) may be porous. Some examples of suitable dielectrics that can be used as the least one interconnect dielectric material (16A, 16B) of the first and second interconnect structures (14A, 14B) include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present application, the dielectric material of the at least one interconnect dielectric material 16A of the first interconnect structure 14A is the same as the dielectric material of the at least one interconnect dielectric material 16B of the second interconnect structure 14B. In other embodiments of the present application, the dielectric material of the at least one interconnect dielectric material 16A of the first interconnect structure 14A is different from the dielectric material of the at least one interconnect dielectric material 16B of the second interconnect structure 14B.

The at least one interconnect dielectric material (16A, 16B) of the first and second interconnect structures (14A, 14B) typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the at least one interconnect dielectric material (16A, 16B) of the first and second interconnect structures (14A, 14B) may vary depending upon the type of dielectric material(s) used. In one example, the at least one interconnect dielectric material (16A, 16B) of the first and second interconnect structures (14A, 14B) may have a thickness from 50 nm to 1000 nm. Other thicknesses that are lesser than, or greater than, the aforementioned thickness range may also be employed in the present application for the thickness of the at least one interconnect dielectric material (16A, 16B) of the first and second interconnect structures (14A, 14B).

The at least one interconnect dielectric material (16A, 16B) of the first and second interconnect structures (14A, 14B) may be formed utilizing a deposition process such as, for example, chemical vapor deposition (CVD), plasma enhanced chemical vapor deposition (PECVD) or spin-on coating.

As mentioned above, one or more interconnect metallic structures 18A can be embedded in the at least one interconnect dielectric material 16A of the first interconnect structures 14A, and one or more interconnect metallic structures 18B can be embedded in the at least one interconnect dielectric material 16B of the second interconnect structures 14B. By "embedded" it is meant each metallic structure (18A, 18B) is contained within the at least one interconnect dielectric material (16A, 16B). As is shown, the topmost surface of each interconnect metallic structure (18A, 18B) is coplanar with a topmost surface of the at least one interconnect dielectric material (16A, 16B).

The one or more interconnect metallic structures (18A, 18B) are composed of copper (Cu), a copper-aluminum alloy (Cu—Al), a copper manganese alloy (Cu—Mn), aluminum (Al) or an aluminum-copper alloy (Al—Cu). In the present application, the one or more interconnect metallic structures 18A are typically composed of a same interconnect metal (i.e., copper, a copper-aluminum alloy, a copper manganese alloy, aluminum or an aluminum-copper alloy) as the one or more interconnect metallic structures 18B.

The one or more interconnect metallic structures (18A, 18B) can be formed by first providing at least one opening into the at least one interconnect dielectric material (16A, 16B) and then filling the at least one opening with an interconnect metal or metal alloy as defined above.

The at least one opening can be formed utilizing a patterning process. In one embodiment, the patterning process may include lithography and etching. The lithographic process includes forming a photoresist (not shown) atop the at least one interconnect dielectric material (16A, 16B), exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening.

The at least one opening that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIGS. 1A and 1B, and by way of an example, the at least one opening that houses each interconnect metallic structure (18A, 18B) is a combined via/line opening. When a via or line is formed, a single damascene process (including the above mentioned lithography and etching steps) can be employed. When a combined via/line is formed a dual damascene process (including at least one iteration of the above mentioned lithography and etching steps) can be employed.

Prior to forming the interconnect metal or metal alloy, a diffusion barrier (not show) can be optionally formed within the at least one opening. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

The interconnect metal or metal alloy is then formed into each opening utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the interconnect metal or metal alloy of each interconnect metallic structure (18A, 18B).

Following the deposition of the interconnect metal or metal alloy, a planarization process such as, for example, chemical mechanical polishing (CMP) and/or grinding, can be used to remove all interconnect metal or metal alloy (i.e., overburden material) that is present outside the at least one opening forming the structures shown in FIGS. 1A and 1B. The planarization stops on a topmost surface of the at least one interconnect dielectric material (16A, 16B) providing the coplanar structures illustrated in FIG. 1A-1B.

The first semiconductor wafer 12A also includes a first bonding oxide layer 20A present on the first interconnect structure 14A, while the second semiconductor wafer 12B also includes a second bonding oxide layer 20B present on the second interconnect structure 14B.

The first and second bonding oxide layers (20A, 20B) are composed of a same dielectric bonding oxide such as, for example, silicon dioxide, tetraethylorthosilicate (TEOS), or fluorinated tetraethylorthosilicate (FTEOS). The first and second bonding oxide layers (20A, 20B) can be formed by a deposition process such as, for example, chemical vapor deposition (CVD) or plasma enhanced chemical vapor deposition (PECVD). The first and second bonding oxide layers (20A, 20B) can have a thickness from 50 nm to 200 nm; although other thicknesses are not excluded from being used in the present application as the thickness of the first and second bonding oxide layers (20A, 20B).

Figure 2A:
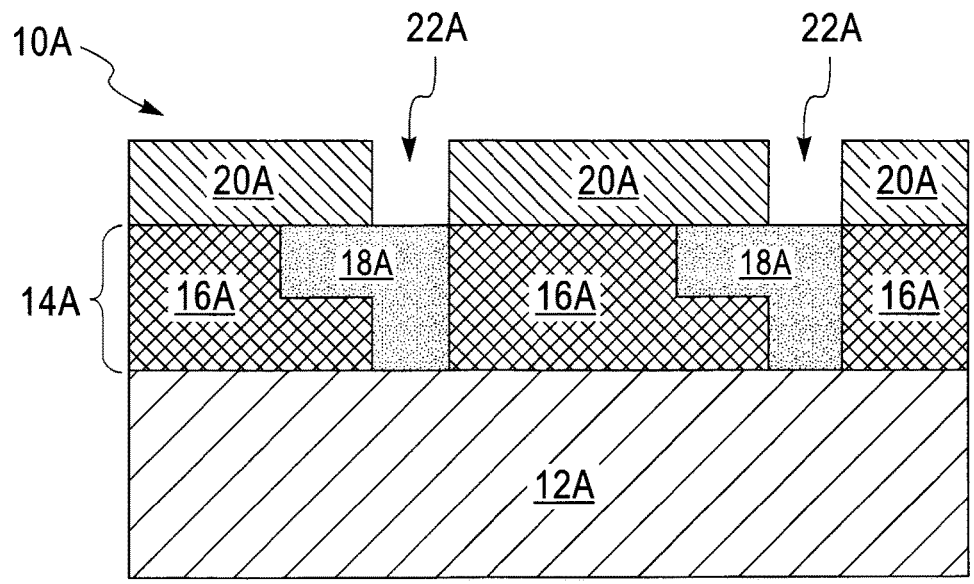
FIG. 2A is a cross sectional view of the first semiconductor structure of FIG. 1A after forming at least one first opening in the first bonding oxide layer.
Figure 2B:
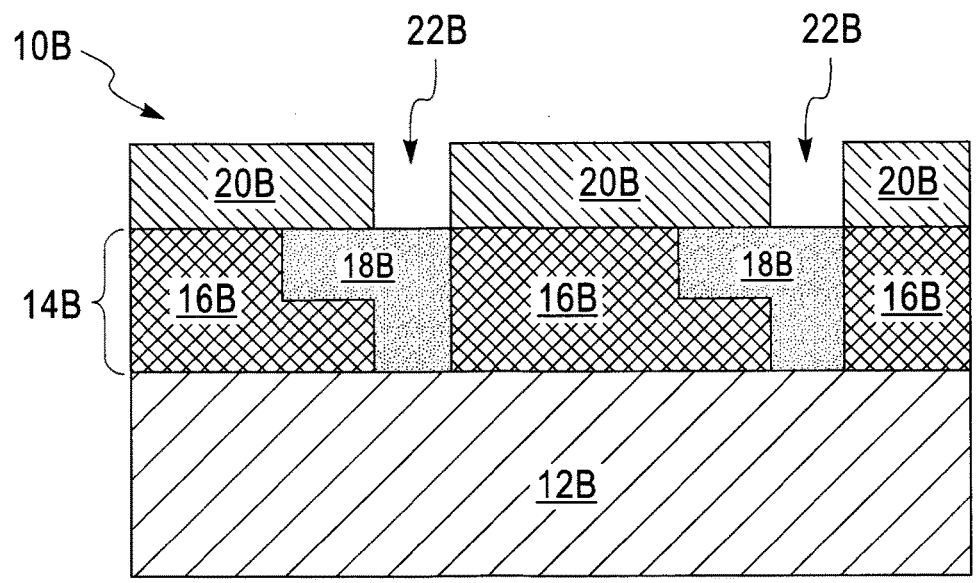
FIG. 2B is a cross sectional view of the second semiconductor structure of FIG. 1B after forming at least one second opening in the second bonding oxide layer.

Referring now to FIG. 2A-2B, there are shown the first semiconductor structure after forming at least one first opening 22A in the first bonding oxide layer 20A, and forming at least one second opening 22B in the second bonding oxide layer 20B. The first and second openings (22A, 22B) may be a via opening, a line opening or a combined line/via opening. In the present application, the first and second openings (22A, 22B) are shown as via openings. The first and second openings (22A, 22B) can be formed by lithography and etching as defined above in forming the openings in the at least one interconnect dielectric material (16A, 16B). The at least one first opening 22A exposes at least a portion of the topmost surface of at least one of the interconnect metallic structures 18A present in the at least one interconnect dielectric material 16A, while the at least second opening 22B exposes at least a portion of the topmost surface of at least one of the interconnect metallic structures 18B present in the at least one interconnect dielectric material 16B.

Figure 3A:
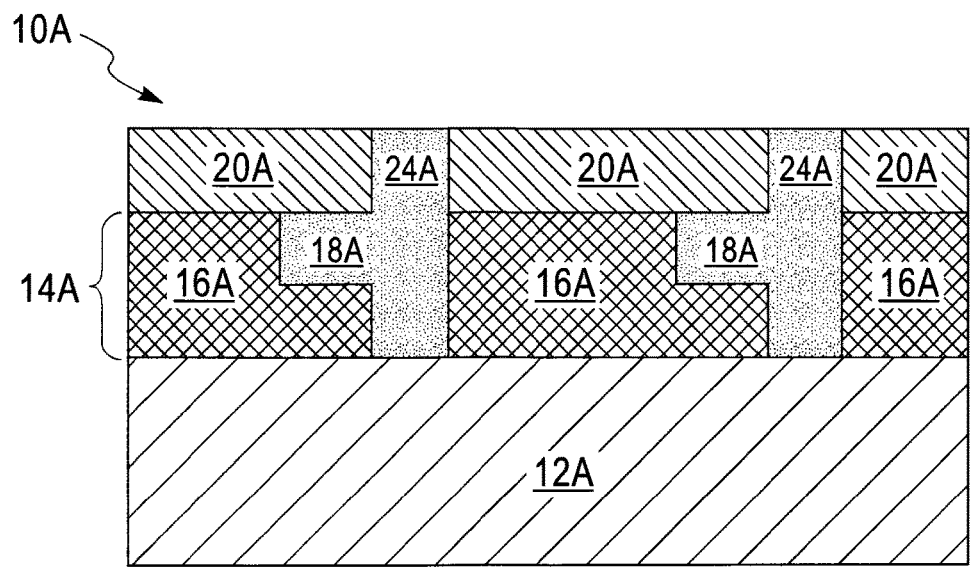
FIG. 3A is a cross sectional view of the first semiconductor structure of FIG. 2A after forming a first metallic bonding structure in the at least one first opening.
Figure 3B:
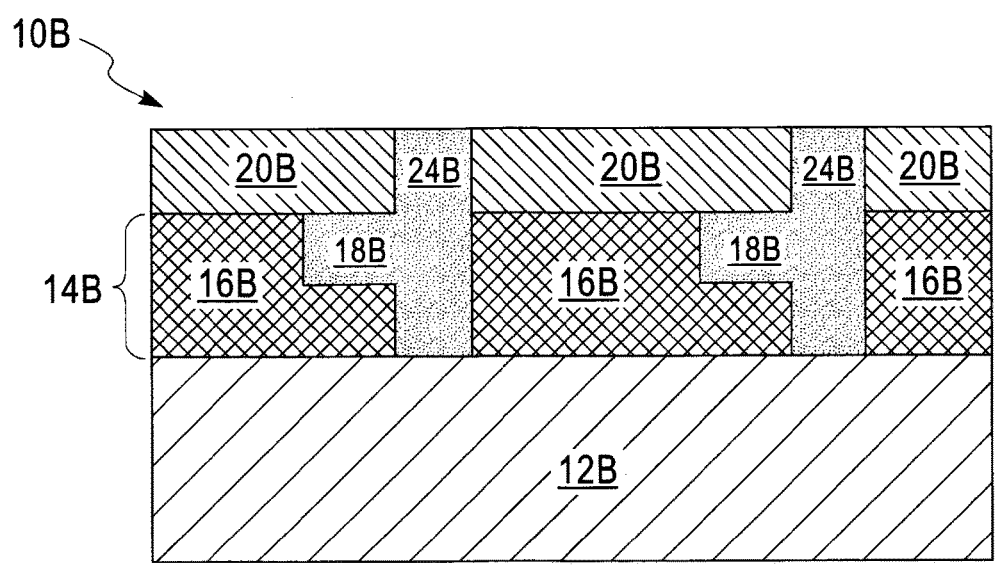
FIG. 3B is a cross sectional view of the second semiconductor structure of FIG. 2B after forming a second metallic bonding structure in the at least one second opening.

Referring now to FIGS. 3A-3B, there are shown the first semiconductor structure after forming a first metallic bonding structure 24A in the at least one first opening 22A, and the second semiconductor structure after forming a second metallic bonding structure 24B in the at least one second opening 22B. The number of first and second metallic bonding structures is determined by the number of opening formed into the first and second bonding oxide layers. The first and second metallic bonding structures (24A, 24B) include a same metallic material selected from copper, a copper-aluminum alloy, a copper manganese alloy, aluminum or an aluminum-copper alloy. Typically, but not necessarily always, the metallic material that provides the first and second metallic bonding structures (24A, 24B) is the same as that of the interconnect metal or metal alloy that provides the one or more interconnect metallic structures (18A, 18B). In one example, the metallic material that provides the first and second metallic bonding structures (24A, 24B) and the interconnect metal or metal alloy that provides the one or more interconnect metallic structures (18A, 18B) are each composed of copper (Cu).

The first and second metallic bonding structures (24A, 24B) can be formed by depositing the metallic material into the respective openings (22A, 22B) formed in the bonding oxide layer (20A, 20B). The deposition of the metallic material that provides the first and second metallic bonding structures (24A, 24B) may include one of the deposition processes mentioned above for depositing the interconnect metal or metal alloy. A planarization process as defined above may be performed to provide the coplanar structures shown in FIGS. 3A-3B. Notably, as shown in FIG. 3A, each first metallic bonding structure 24A has a topmost surface that is coplanar with a topmost surface of the first bonding oxide layer 20A, while and as shown in FIG. 3B, each second metallic bonding structure 24B has a topmost surface that is coplanar with a topmost surface of the second bonding oxide layer 20B.

At this point of the present application, the first and second structures shown in FIGS. 3A and 3B may be subjected to a pre-bake step. When employed, the pre-bake step can be performed at a temperature from 100° C. to 700° C. for a duration from 30 minutes to 4 hours and in a $N_2$ ambient or $N_2/H_2$ (i.e., a combined nitrogen and hydrogen) ambient. The pre-bake step readies the structures shown in FIGS. 3A-3B for a subsequently performed nitridation process.

Figure 4A:
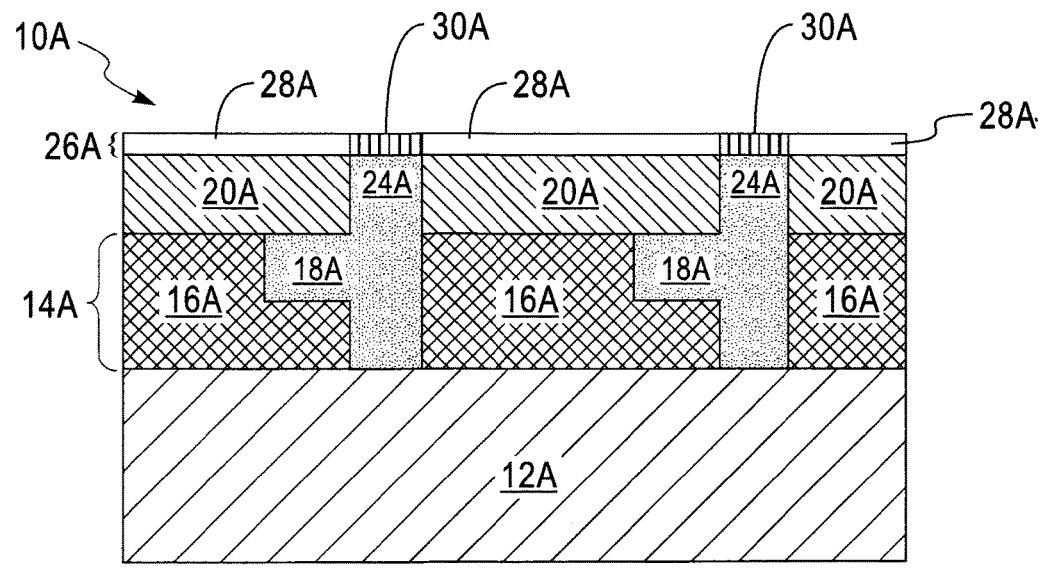
FIG. 4A is a cross sectional view of the first semiconductor structure of FIG. 3A after performing a nitridation process to provide a first nitrided surface layer containing first nitridized oxide regions and first nitridized metallic regions.
Figure 4B:
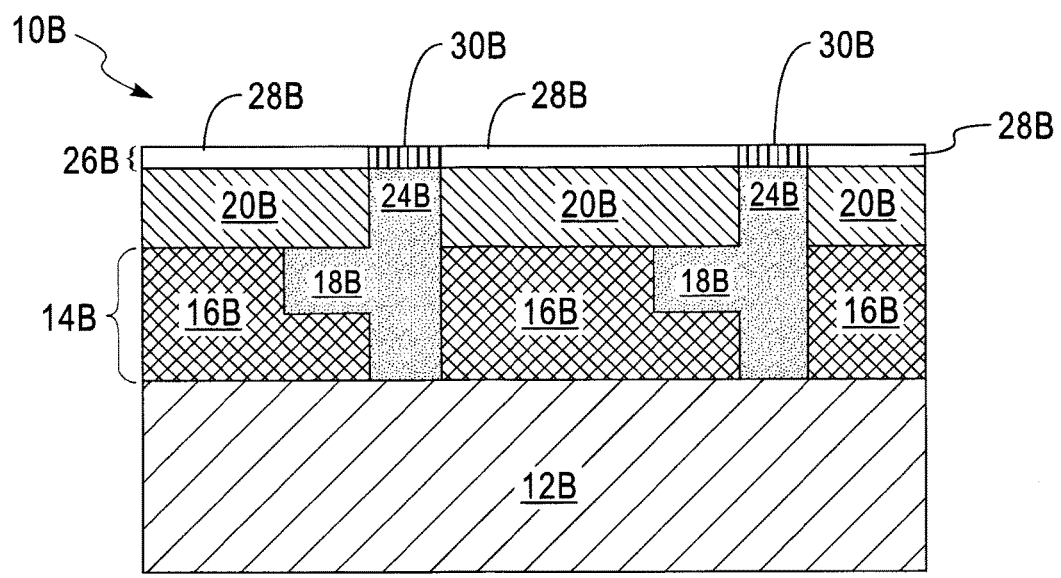
FIG. 4B is a cross sectional view of the second semiconductor structure of FIG. 3B after performing a nitridation process to provide a second nitrided surface layer containing second nitridized oxide regions and second nitridized metallic regions.

Referring now FIG. 4A, there is illustrated the first semiconductor structure of FIG. 3A after performing a nitridation process to provide a first nitrided surface layer 26A containing first nitridized oxide regions 28A and first nitridized metallic regions 30A, while FIG. 4B shows the second semiconductor structure of FIG. 3B after performing a nitridation process to provide a second nitrided surface layer 26B containing second nitridized oxide regions 28B and second nitridized metallic regions 30B. The nitridation process used to form the first and second nitrided surface layers (26A, 26B) is a surface treatment process in which the upper portion of the bonding oxide layer and the metallic bonding structures are nitrided. Nitridation of the first and second semiconductor structures shown in FIGS. 3A and 3B may be performed together or separately.

The first and second nitridized oxide regions (28A, 28B), which are formed into an upper portion of the respective bonding oxide layers (20A, 20B), may also be referred to herein as a nitrogen enriched oxide surface region. By "nitrogen enriched oxide surface region" it is meant, that the exposed upper portion of the bonding oxide layer (20A, 20B) has a higher nitrogen content therein after performing the nitridation process as compared to the originally deposited oxide bonding layer (20A, 20B).

The nitridized metallic regions (30A, 30B), which are formed into an upper portion of the respective metallic bonding structures (24A, 24B), may also be referred to herein as a nitrogen enriched metallic surface region. By "nitrogen enriched metallic surface region" it is meant, that the exposed upper portion of the metallic bonding structure (24A, 24B) has a higher nitrogen content therein after performing the nitridation process as compared to the originally formed metallic bonding structure (24A, 24B).

In one embodiment, the nitridation process used in forming the first and second nitrided surface layers (26A, 26B) is a thermal nitridation process. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 500° C. In another embodiment, the thermal nitridation process employed in the present application is performed at a temperature from 80° C. to 300° C.

In addition to a thermal nitridation process, the formation of the first and second nitrided surface layers (26A, 26B) can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 500° C. In another embodiment, the plasma nitridation process employed in the present application is performed at a temperature from 80° C. to 300° C. In another embodiment, the nitrogen-containing ambient can be mixed with an inert gas such as, for example, helium, neon, argon and mixtures thereof. In some embodiments, hydrogen can be used to mix the nitrogen-containing ambient.

Notwithstanding the type of nitridation employed, the depth of the first and second nitrided surface layers (26A, 26B) may vary. Typically, the depth of the first and second nitrided surface layers (26A, 26B), as measured from the topmost exposed surface of a material layer inward, is from 0.5 nm to 20 nm, with a depth from 1 nm to 10 nm being more typical. It is noted that the depth of the first and second nitrided surface layers (26A, 26B) includes the depth of each nitridized oxide region (28A, 28B) and of each nitridized metallic region (30A, 30B), Each first and second nitridized oxide region (28A, 28B) is composed of a same oxide material as the bonding oxide layer (20A, 20B) with added nitrogen. In some embodiments, the nitrogen content of the first and second nitridized oxide regions (28A, 28B) is 10 atomic percent or greater. In one embodiment of the present application, the nitrogen content of the first and second nitridized oxide region (28A, 28B) can be from 10 atomic percent nitrogen to 50 atomic percent nitrogen. Nitrogen contents of less than 10 atomic percent are also contemplated.

Each first and second nitridized metallic region (30A, 30B) is composed of a same metallic material as the metallic bonding structure (24A, 24B) with added nitrogen. In some embodiments, the nitrogen content of the first and second nitridized metallic regions (30A, 30B) is 10 atomic percent or greater. In one embodiment of the present application, the nitrogen content of the first and second nitridized metallic regions (30A, 30B) can be from 10 atomic percent nitrogen to 50 atomic percent nitrogen. Nitrogen contents of less than 10 atomic percent are also contemplated.

Figure 5A:
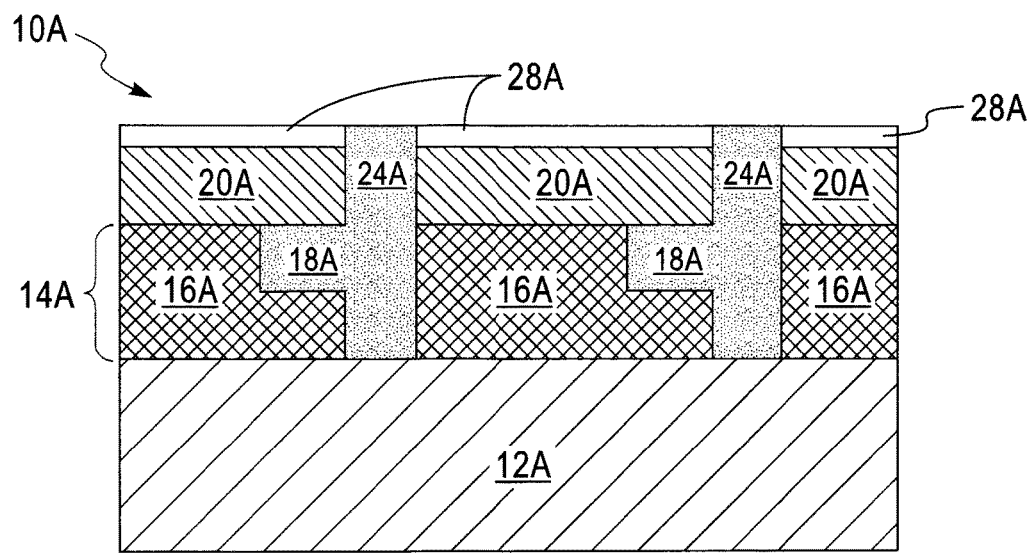
FIG. 5A is a cross sectional view of the first semiconductor structure of FIG. 4A after removing nitrogen from each of the first nitridized metallic regions of the first nitrided surface layer.
Figure 5B:
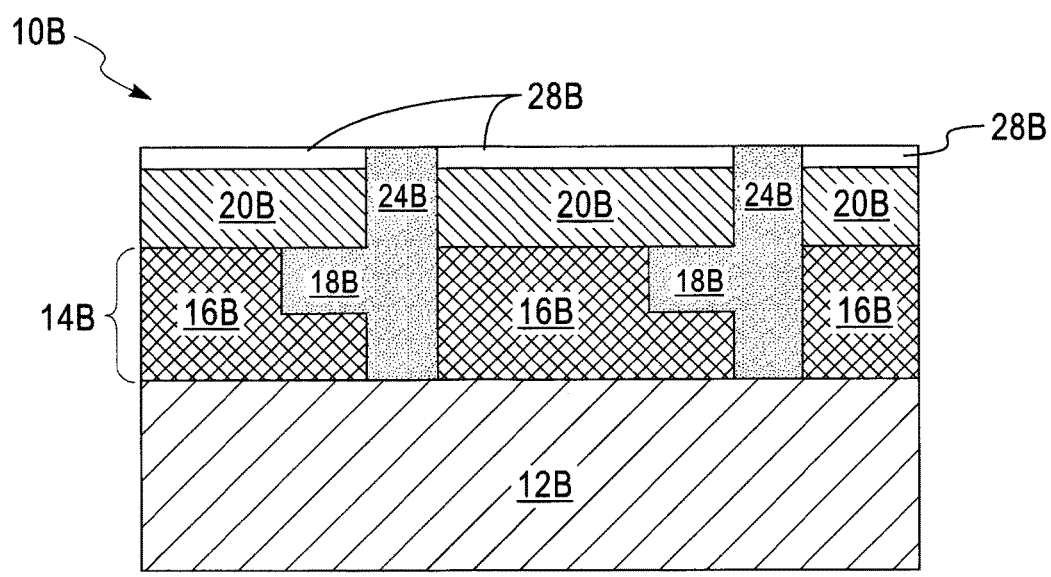
FIG. 5B is a cross sectional view of the second semiconductor structure of FIG. 4B after removing nitrogen from each of the second nitridized metallic regions of the second nitrided surface layer.

Referring now to FIGS. 5A-5B, there are illustrated the respective semiconductor structures of FIGS. 4A-4B, after removing nitrogen from each of the nitridized metallic regions (30A, 30B). Nitrogen removal from each of the nitridized metallic regions (30A, 30B) converts the first and second nitridized metallic regions (30A, 30B) into regions that have a same composition as the first and second metallic bonding structures. The converted regions are not separately numbered since they have the same composition as the original metallic bonding structures (24A, 24B). For example, when the metallic bonding structures (24A, 24B) are composed of Cu, the above mentioned surface treatment process forms nitrided copper (i.e., copper nitride) as nitridized metallic regions (30A, 30B), which after nitrogen removal converts the nitridized copper back to just copper.

The removal of nitrogen from each of the nitridized metallic regions (30A, 30B) is performed selective to the nitridized oxide regions (28A, 28B); the bonding strength between nitrogen and the metal within the nitridized metallic regions (30A, 30B) is weak, therefore a reduction can be selectively carried out on the nitridized metallic regions (30A, 30B). The removal may be performed in a gaseous or plasma ambient of hydrogen, helium, argon or a mixture thereof. The removal may be performed at a temperature from 80° C. to 350° C. In the present application, all of the nitrogen is removed from the nitridized metallic regions (30A, 30B) converting those regions back into the original composition of the metallic bonding structure. Little or no nitrogen is removed from the nitridized oxide regions (28A, 28B) since strong bonding exists between nitrogen and oxide within the nitridized oxide regions (28A, 28B).

Figure 6:
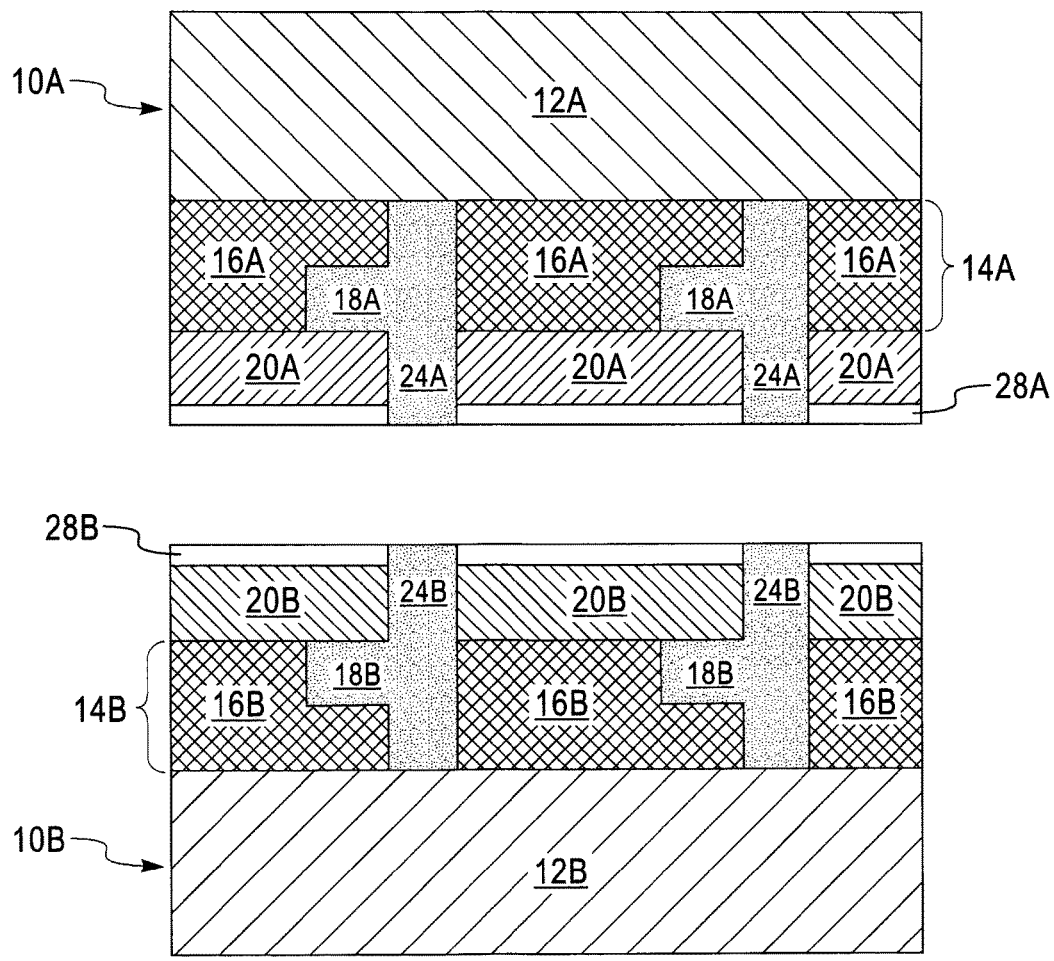
FIG. 6 is a cross sectional view of the first and second semiconductor structures of FIGS. 5A and 5B after performing a wafer to wafer alignment process.

Referring now to FIG. 6, there is shown the first and second semiconductor structures of FIGS. 5A and 5B after performing a wafer to wafer alignment process. The wafer to wafer alignment process includes flipping one of the semiconductor structures upside down and placing the flipped semiconductor structure over the unflipped semiconductor structure such that the first nitridized oxide regions 28A are aligned with the second nitridized oxide regions 28B, and such that the first metallic bonding structures 24A are aligned with the second metallic bonding structures 24B. The wafer to wafer aligned may be performed by hand or by utilizing a robot arm.

Figure 7:
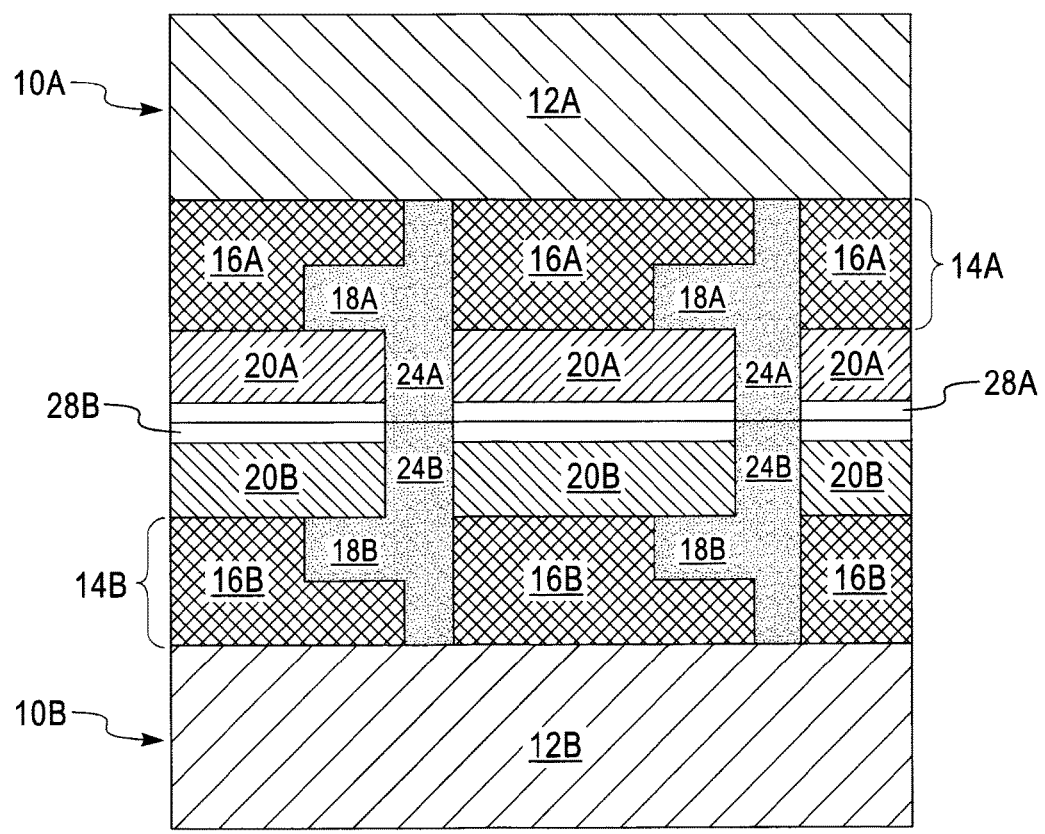
FIG. 7 is a cross sectional view of the first and second semiconductor structures of FIG. 6 after wafer bonding.

Referring now to FIG. 7, there is illustrated the first and second semiconductor structures of FIG. 6 after wafer bonding. Wafer bonding includes bring the two semiconductor structures in intimate contact with each other, with or without application of an external force, and thereafter performing a bonding anneal that permanently bonds the two structures to each other. The resulted structure maximizes the bonding strength for both the nitridized oxide regions (28A, 28B) and the metallic bonding structures (24A, 24B).

The bonding anneal may be performed at a temperature from 100° C. to 700° C. and in an ambient including nitrogen, hydrogen, helium or any mixtures thereof (i.e., nitrogen/helium or nitrogen/hydrogen or helium/hydrogen).

FIG. 7 illustrates a three-dimensional bonded semiconductor structure of the present application. The three-dimensional bonded semiconductor structure of FIG. 7 includes a first semiconductor structure 10A including a first wafer 12A, a first interconnect structure 14A, and a first bonding oxide layer 20A containing first nitridized oxide regions 28A and at least one first metallic bonding structure 24A embedded therein. The bonded structure further includes a second semiconductor structure 10B including a second wafer 12B, a second interconnect structure 14B, and a second bonding oxide layer 20B containing second nitridized oxide regions 28B and at least one second metallic bonding structure 24B embedded therein. In the present application, a bonding interface is present between the first and second nitridized oxide regions (28A, 28B) and another bonding interface is present between the at least one first and second metallic bonding structures (24A, 24B). By "bonding interface" it is meant that the contacting surfaces of two materials are joined together by a chemical bond(s).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a three-dimensional (3D) bonded semiconductor structure, said method comprising:
providing a first semiconductor structure including a first wafer, a first interconnect structure, and a first bonding oxide layer containing at least one first metallic bonding structure composed of a first metal or metal alloy embedded therein, and a second semiconductor structure including a second wafer, a second interconnect structure, and a second bonding oxide layer containing at least one second metallic bonding structure composed of a second metal or metal alloy embedded therein,
performing a nitridation process to provide a first nitrided surface layer comprising first nitridized oxide regions in an upper portion of said first bonding oxide layer and a first nitridized metallic region in an upper portion of said at least one first metallic bonding structures, and to provide a second nitrided surface layer comprising second nitridized oxide regions in an upper portion of said second bonding oxide layer and a second nitridized metallic region in an upper portion of said at least one second metallic bonding structure, wherein said first nitridized metallic region is composed of said first metal or metal alloy with added nitrogen and said second nitridized metallic region is composed of said second metal or metal alloy with added nitrogen;
removing said added nitrogen from an entirety of said first and second nitridized metallic regions to convert said entirety of said first and second nitridized metallic regions into regions that contain said first metal or metal alloy and said second metal or metal alloy, respectively; and
bonding said first semiconductor structure to said second semiconductor structure, wherein said bonding provides a bonding interface between said first and second nitridized oxide regions and another bonding interface between said at least one first and second metallic bonding structures.

2. The method of claim 1 wherein said performing said nitridation process comprises a thermal nitridation process, wherein said thermal nitridation process is performed at a temperature from 50° C. to 500° C. in a nitrogen-containing ambient.

3. The method of claim 1, wherein performing said nitridation process comprises a plasma nitridation process, wherein said plasma nitridation process is performed at a temperature from 50° C. to 500° C. in a nitrogen-containing ambient.

4. The method of claim 1, further comprising performing a pre-bake step prior to performing said nitridation process, wherein said pre-bake step is performed at a temperature from 100° C. to 700° C. in nitrogen or a mixture of nitrogen and hydrogen.

5. The method of claim 1, wherein said removing nitrogen from said first and second nitridized metallic regions is performed in a gaseous or plasma ambient of hydrogen, helium, argon or a mixture thereof, and at a temperature from 80° C. to 350° C.

6. The method of claim 1, wherein said bonding comprises:
performing wafer to wafer alignment;
bringing said first semiconductor structure into intimate contact with said second semiconductor structure; and
annealing at a temperature from 100° C. to 700° C. and in ambient including at least one of nitrogen, hydrogen, and helium.

7. The method of claim 1, wherein said at least one first and second metallic bonding structures comprise copper, and wherein said first and second nitridized metallic regions comprise copper nitride.

8. The method of claim 1, wherein each of said first and second interconnect structures comprises at least one interconnect dielectric material and one or more interconnect metallic structures embedded therein.

9. The method of claim 1, wherein said first and second nitridized oxide regions comprise an oxide and added nitrogen, and wherein said first and second nitrided metallic regions comprise at least one of Cu and Al, and added nitrogen.

10. The method of claim 9, wherein said added nitrogen in said first and second nitridized oxide regions and in said first and second nitrided metallic regions is present in an amount from 10 atomic percent nitrogen to 50 atomic percent nitrogen.

* * * * *